(12) United States Patent
Xiao et al.

(10) Patent No.: US 11,716,875 B2
(45) Date of Patent: Aug. 1, 2023

(54) DISPLAY SUBSTRATE, METHOD FOR MANUFACTURING SAME AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Leifang Xiao, Beijing (CN); Peng Xu, Beijing (CN); Weiwei Ding, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 553 days.

(21) Appl. No.: 16/867,597

(22) Filed: May 6, 2020

(65) Prior Publication Data
US 2021/0167138 A1 Jun. 3, 2021

(30) Foreign Application Priority Data
Nov. 29, 2019 (CN) .......................... 201911204959.6

(51) Int. Cl.
*H01L 21/00* (2006.01)
*H10K 59/121* (2023.01)
(Continued)

(52) U.S. Cl.
CPC ....... *H10K 59/121* (2023.02); *H10K 50/8426* (2023.02); *H10K 59/60* (2023.02); *H10K 71/00* (2023.02)

(58) Field of Classification Search
CPC ............................ H01L 27/326; H10K 59/121
See application file for complete search history.

(56) References Cited

U.S. PATENT DOCUMENTS 10,084,150 B1 9/2018 Lou
10,381,381 B1 * 8/2019 Choi .................. H01L 27/3227
(Continued)

FOREIGN PATENT DOCUMENTS

CN 106981585 A 7/2017
CN 109143648 A 1/2019
(Continued)

OTHER PUBLICATIONS

China National Intellectual Property Administration, First office action of Chinese application No. 201911204959.6 dated Oct. 14, 2022, which is foreign counterpart application of this US application.

(Continued)

*Primary Examiner* — Douglas M Menz
(74) *Attorney, Agent, or Firm* — Lippes Mathias LLP

(57) ABSTRACT

Disclosed is a display substrate and a manufacturing method thereof and a display device. The display substrate includes an array substrate, an anode layer and a light-emitting layer which are sequentially stacked, and at least one film layer that is positioned on the light-emitting layer, wherein the at least one film layer includes a target film layer. The display substrate includes a first display area and a second display area which are adjacent to each other, wherein in the first display area, the target film layer has hollowed-out portions; and in the second display area, the target film layer is in a non-hollowed-out structure.

19 Claims, 13 Drawing Sheets

(51) Int. Cl.
*H10K 50/842* (2023.01)
*H10K 59/60* (2023.01)
*H10K 71/00* (2023.01)

(56) References Cited

U.S. PATENT DOCUMENTS

| | | |
|---|---|---|
| 2019/0221782 A1 | 7/2019 | Sun et al. |
| 2021/0217955 A1 | 7/2021 | Hu et al. |
| 2022/0155831 A1 | 5/2022 | Sun et al. |

FOREIGN PATENT DOCUMENTS

| | | |
|---|---|---|
| CN | 109554665 A | 4/2019 |
| CN | 109786432 A | 5/2019 |
| CN | 109786582 A | 5/2019 |
| CN | 109886140 A | 6/2019 |
| CN | 110034152 A | 7/2019 |
| CN | 110148611 A | 8/2019 |
| CN | 209232823 U | 8/2019 |
| CN | 110349993 A | 10/2019 |
| CN | 110416272 A | 11/2019 |
| CN | 110473988 A | 11/2019 |
| JP | 2007004997 A | 1/2007 |
| JP | 2007200907 A | 8/2007 |
| WO | 2019114271 A1 | 6/2019 |

OTHER PUBLICATIONS

Yang Li et al., A Poly-Crystalline Si Anode Microcavity Organic Light Emitting Device and Its Simplified Preparation Process Flow, Journal of Semiconductors, vol. 29 No. 1, Jan. 15, 2018, entire document.

\* cited by examiner

DISPLAY SUBSTRATE, METHOD FOR MANUFACTURING SAME AND DISPLAY DEVICE

This application claims priority to Chinese Patent Application No. 201911204959.6, filed on Nov. 29, 2019 and entitled "DISPLAY SUBSTRATE, METHOD FOR MANUFACTURING SAME, AND DISPLAY DEVICE", the entire contents of which are incorporated by reference herein.

TECHNICAL FIELD

The present disclosure relates to the technical field of display, and more particularly to a display substrate and a method for manufacturing the same, and a display device.

BACKGROUND

With users' experience demands for the appearance aesthetics and visual perception of terminals with high screen-to-body ratio, mobile terminals are gradually developing to those full-screen terminals, and are being placed to the market. In order to improve the overall screen-to-body ratio and the aesthetics of the mobile terminals, under-the-screen face recognition is also under progressive advancement.

SUMMARY

Embodiments of the present disclosure provide a display substrate and a method for manufacturing the same, and a display device.

Embodiments of the present disclosure provide a display substrate. The display substrate includes an array substrate, an anode layer, and a light-emitting layer which are sequentially stacked, and at least one film layer positioned on the light-emitting layer; wherein the at least one film layer includes a target film layer; and the display substrate includes a first display area and a second display area which are adjacent to each other; wherein, in the first display area, the target film layer has hollow; and in the second display area, the target film layer is in a non-hollowed-out structure.

In one implementation of embodiments of the present disclosure, in the first display area, the target film layer includes a plurality of block structures which are arranged in an array, and a connecting structure for connecting two adjacent block structures; and in the second display area, the target film layer includes a plurality of block structures which are arranged in an array.

In another implementation of embodiments of the present disclosure, the block structures are rectangular; the connecting structure is strip-shaped; and two ends of the each of connecting structures are respectively connected to opposite sides of two adjacent block structures.

In another implementation of embodiments of the present disclosure, the block structure and the connecting structure are both rectangular; a plurality of connecting structures are arranged in an array; and four corners of each of the connecting structures are respectively connected to corners of the four block structures.

In another implementation of embodiments of the present disclosure, the anode layer includes a plurality of anodes which are arranged in an array; each of the block structures corresponds to at least one of the anodes; and an orthographic projection of each of the block structures on the array substrate covers an orthographic projection of the corresponding anode on the array substrate.

In another implementation of embodiments of the present disclosure, pixels per inch of the first display area is not more than pixels per inch of the second display area.

In another implementation of embodiments of the present disclosure, the target film layer includes at least one of a cathode layer, an adhesive layer, and a capping layer.

In another implementation of embodiments of the present disclosure, a material of the target film layer includes a metal element.

Embodiments of the present disclosure further provide a method for manufacturing method a display substrate. The method includes: providing a target substrate, wherein the target substrate includes an array substrate, an anode layer, and a light-emitting layer which are sequentially stacked; and forming at least one film layer on the light-emitting layer, the at least one film layer including a target film layer; wherein in the first display area of the target substrate, the target film layer has hollowed-out portions; in the second display area of the target substrate, the target film layer is in a non-hollowed-out structure; and the first display area and the second display area are adjacent to each other.

In another implementation of embodiments of the present disclosure, forming the target film layer on the light-emitting layer includes: forming a first film layer on the light-emitting layer, wherein the first film layer is positioned in the first display area and has hollowed-out portions; and forming a second film layer covering the second display area on the light-emitting layer, wherein the second film layer is in a non-hollowed-out structure, and the first film layer and the second film layer form the target film layer.

In another implementation of embodiments of the present disclosure, forming the first film layer on the light-emitting layer includes: forming block structures which are arranged in an array in the first display area by a first grid mask, wherein openings on the first grid mask are rectangular openings which are arranged in an array; and forming a connecting structure for connecting two adjacent block structures in the first display area by a second grid mask, wherein the connecting structure is strip-shaped and openings on the second grid mask are strip-shaped openings.

In another implementation of embodiments of the present disclosure, forming the first film layer on the light-emitting layer includes: forming block structures which are arranged in an array in the first display area by a first grid mask, wherein openings on the first grid mask are rectangular openings which are arranged in an array; translating the first grid mask; and forming a plurality of connecting structures which are arranged in an array in the first display area by the first grid mask, wherein four corners of each of the connecting structures are respectively connected to corners of the four block structures.

In another implementation of embodiments of the present disclosure, forming the second film layer covering the second display area on the light-emitting layer includes: forming an entire-surface film layer in the second display area by a single opening mask, wherein the single opening mask is provided with an opening corresponding to the second display area.

Embodiments of the present disclosure further provide a display device. The display device includes a display substrate as described above.

In another implementation of embodiments of the present disclosure, the display device further includes a photosensitive device, wherein an orthographic projection of the photosensitive device on the display substrate falls within the first display area.

BRIEF DESCRIPTION OF THE DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and a person of ordinary skill in the art may also derive other drawings from these accompanying drawings without creative efforts.

DETAILED DESCRIPTION

For clearer descriptions of the principles, technical solutions and advantages in the present disclosure, the implementation of the present disclosure is described in detail below in combination with the accompanying drawings.

Figure 1:
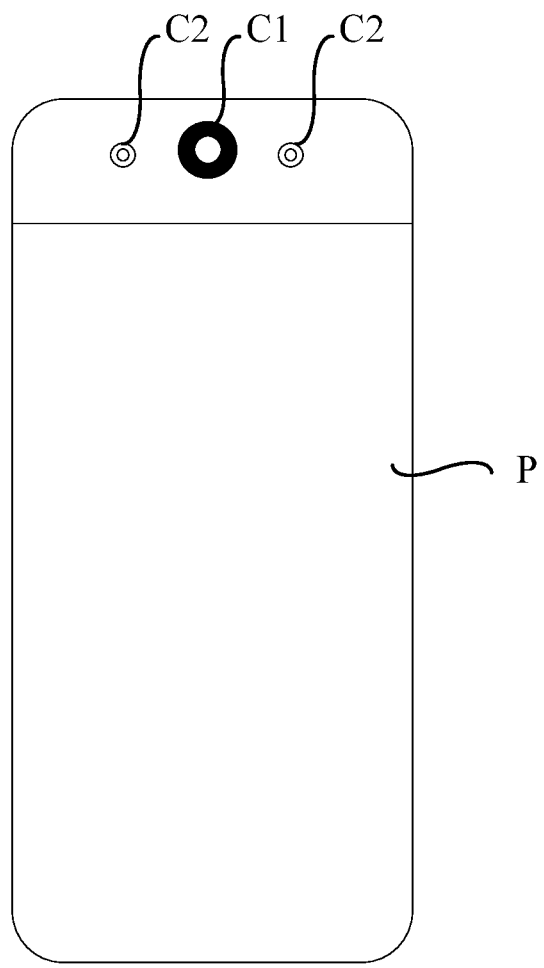
FIG. 1 is a front view of a display panel according to the related art.

FIG. 1 is a front view of a display panel according to the related art. As shown in FIG. 1, an infrared camera C1 and an infrared light-emitting device C2 are arranged on a display panel P.

Figure 2:
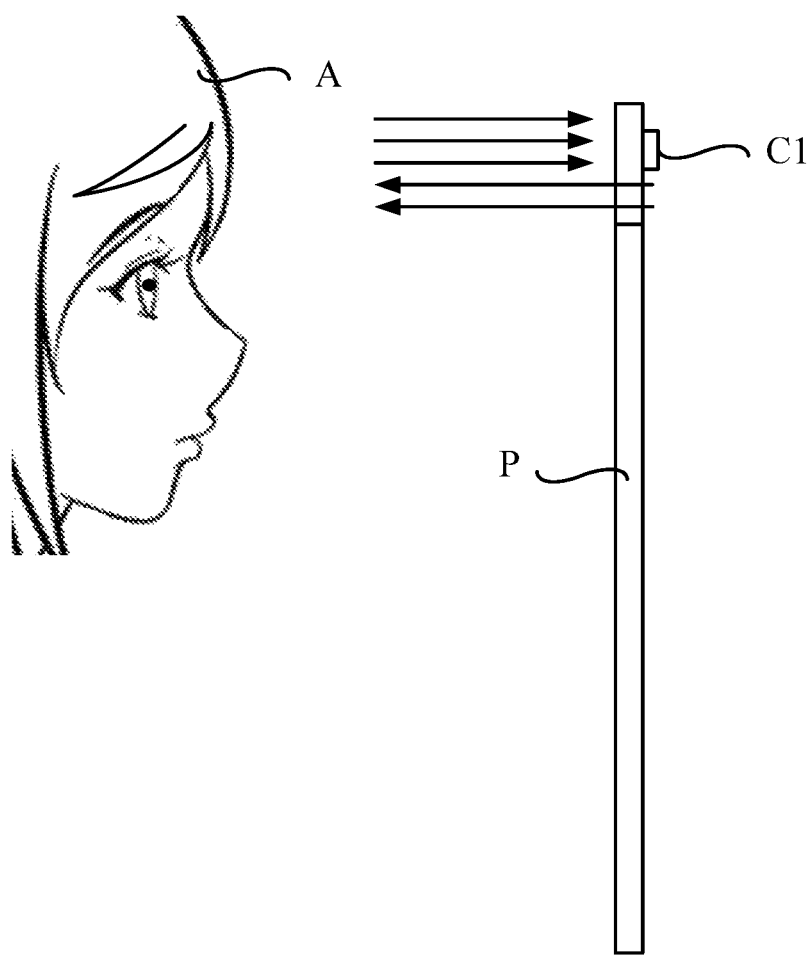
FIG. 2 is a side view of a display panel according to the related art.

FIG. 2 is a side view of a display panel according to the related art. As shown in FIG. 2, the infrared camera C1 and the infrared light-emitting device C2 (not shown in FIG. 2) are both arranged below the display panel P. That is, the display panel A is distal from a user A, such that the screen-to-body ratio is increased.

However, when the infrared camera C1 and the infrared light-emitting device C2 are arranged below the display panel P, infrared light emitted by the infrared light-emitting device C2 passes through the display panel P and is irradiated on a target object A. Then the infrared light reflected by the target object A is transmitted to the infrared camera C1 by penetrating through the display panel P. When the target object A is a person, face recognition may be performed according to a signal acquired by the infrared camera. For efficient face recognition, it is necessary to increase the light transmittance of the display panel, such that more infrared light is transmitted to the infrared camera.

In the related art, when the light transmittance of the display panel is increased, adjacent pixel areas in the display panel are controlled to be more sparsely distributed, such that anodes and control circuits of various pixels are controlled to be more sparsely distributed, making infrared light more easily penetrate through the display panel easily to increase the light transmittance. Since the pixel areas are not densely distributed in this way, pixels per inch (PPI) of the display panel and the display effect of the display panel are reduced.

Figure 3:
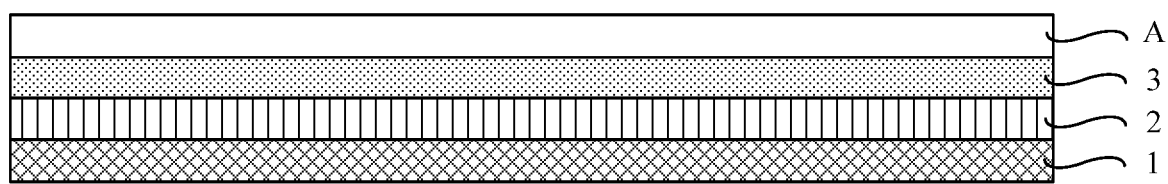
FIG. 3 is a schematic structural diagram of layers of a display substrate according to an embodiment of the present disclosure.

An embodiment of the present disclosure provides a display substrate. FIG. 3 is a schematic structural diagram of layers of a display substrate according to an embodiment of the present disclosure. As shown in FIG. 3, the display substrate includes an array substrate 1, an anode layer 2, and a light-emitting layer 3 which are sequentially stacked, and at least one film layer A positioned on the light-emitting layer 3. The at least one film layer A includes a target film layer.

Figure 4:
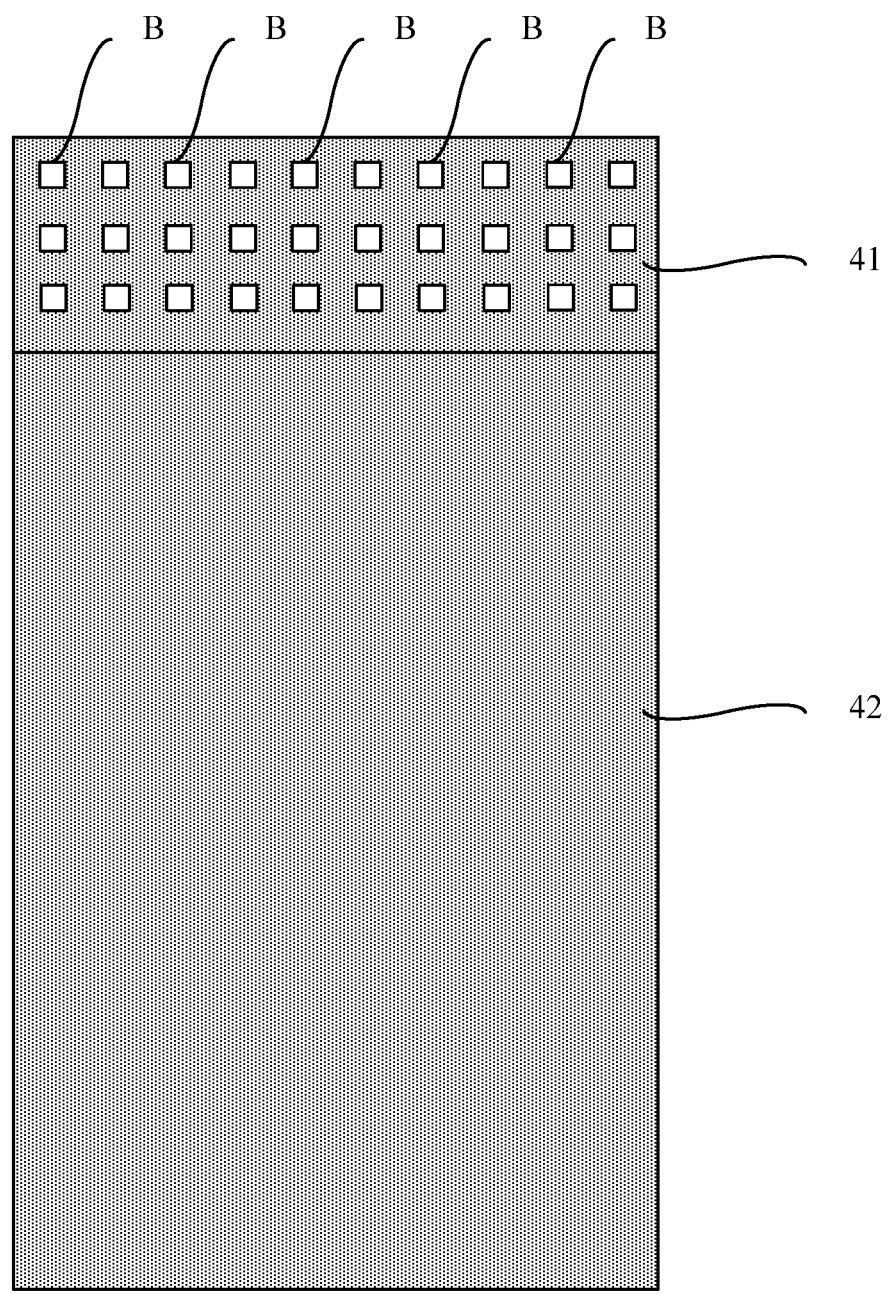
FIG. 4 is a schematic structural diagram of a display substrate according to an embodiment of the present disclosure.

FIG. 4 is a schematic structural diagram of a display substrate according to an embodiment of the present disclosure. As shown in FIG. 4, the display substrate includes a first display area 41 and a second display area 42; wherein in the display area 41, the target film layer has hollowed-out portions B; and in the second display area 42, the target film layer has a non-hollowed-out structure.

The non-hollowed-out structure refers to that the target film layer is in an entire-surface structure in the second display area 42.

In the embodiment of the present disclosure, the display area refers to an area where an image is displayed, and is also referred to as an effective display area. The first display area 41 and the second display area 42 belong to the display area. As shown in FIG. 4, the first display area 41 and the second display area 42 are adjacent to each other.

In the embodiment of the present disclosure, the first display area 41 is an area opposite to a photosensitive device (such as the infrared camera). That is, an orthographic projection of the photosensitive device on the display substrate falls within the first display area. The photosensitive device is usually positioned in an edge area of the display area, such that the first display area may be positioned at a periphery of the second display area or the edge area in the second display area.

It should be noted that the shapes and positional relationships of the first display area 41 and the second display area 42 in FIG. 4 are only examples. For example, in some implementations, the first display area may be annular, the second display area may be circular, and the second display area is positioned in the first display area; or the first display area is L-shaped, the second display area is rectangular, and the first display area is positioned on two adjacent sides of the second display area; or the first display area is round, the second display is provided with a circular opening, and the first display area is positioned in the opening of the second display area or the like.

At least one film layer on a light-emitting layer of a display substrate includes a target film layer according to an embodiment of the present disclosure. Furthermore, the target film has hollowed-out portions in the first display area, such that light can pass through the first display area of the display substrate through the hollowed-out portions on the target film layer and is transmitted from one side of the display substrate to the other side. Thus, when an infrared camera is arranged below the first display area of the display substrate, the infrared camera can obtain infrared light reflected from the human face easily. The recognition efficiency of under-the-screen face recognition is improved by increasing the light transmittance of part of film layer of the display substrate. Meanwhile, the target film layers are all in a non-hollowed-out structure, which are positioned above the light-emitting layer and in the second display area of the display substrate. It may be ensured that each of the anodes of the anode layer in the second display area of the display substrate may be opposite to the cathode layer on the light-emitting layer positioned in the second display area, and each of the anodes in the second display area may play a full role to ensure the light-emitting effect of the display substrate.

In some embodiments, the PPI in the first display area is less than that in the second display area. In other embodiments, the PPI in the first display area is equal to that in the second display area. That is, the PPI in the first display area is not less than that in the second display area. The higher the PPI is, the lower the corresponding light transmittance is, thus the PPI in the first display area is not less than that in the second display area, which is favorable for reducing the light transmittance of the first display area.

In the embodiment of the present disclosure, the target film layer may include at least one of a cathode layer, an adhesive layer positioned on the cathode layer, and a capping layer (CPL) positioned on the adhesive layer. That is, in the embodiment of the present disclosure, at least one of the cathode layer, the adhesive layer, and the CPL has hollowed-out portions in the first display area.

For example, a material of the cathode layer may include a metal element. For example, the material of the cathode layer may be Ag, Mg:Ag, Al:Ag, Yb:Ag or compositions thereof. Alternatively, the material of the cathode layer may also be ITO, IZO, or the like.

The CPL is a protective film layer covering the cathode layer, and may be made of an organic material. Due to poorer adhesion properties between the CPL made of the organic material and the cathode layer made of metal material, an adhesive layer is arranged between the CPL and the cathode layer in this embodiment. For example, the adhesion between the CPL and the cathode layer are more firmly by a lithium fluoride (LIF) film layer.

Due to low light transmittance of the film layer including metal, in the embodiment of the present disclosure, the film layer including a metal element can be served as the target film layer to greatly increase the light transmittance of the first display area.

For example, in the embodiment of the present disclosure, an array substrate 1 may include a substrate, and a plurality of sub-pixel units which are distributed on the substrate in an array. Each of the sub-pixel units includes at least two thin film transistor (TFT), and the thin film transistors in each of the sub-pixel units can be used to control the light-emitting layer of the corresponding OLED to emit light. That is, the display substrate in the embodiment of the present disclosure can be an AMOLED display substrate.

An array substrate A may also be called as a TFT substrate. For example, the TFT substrate may include a substrate, an active layer, a gate insulation layer, a gate metal layer, an interlayer dielectric layer and a source and drain metal layer that are sequentially stacked.

For example, a material for manufacturing the substrate may be glass, quartz, or the like; a material for manufacturing the active layer may be amorphous silicon, polycrystalline silicon or a metal-oxide semiconductor; a material for manufacturing the gate insulation layer may be silicon oxide or silicon nitride, silicon oxynitride, or the like; a material for manufacturing the gate metal layer may be a single-layer metal film of molybdenum, copper, titanium, or the like, and may also be a multi-layer metal film of molybdenum-aluminum-molybdenum or titanium-aluminum-titanium, or the like; a material for manufacturing the interlayer dielectric layer may be silicon oxide or silicon nitride, or the like; a material for manufacturing the source and drain metal layer may be a single-layer metal film of aluminum, molybdenum, copper, titanium, or the like, and may also be a multi-layer film of molybdenum-aluminum-molybdenum or titanium-aluminum-titanium, or the like.

It should be noted that, the example only lists the TFT substrate structure with the single-layer gate metal layer, the TFT substrate structure may also be various structures such as a double-layer gate metal layer, or the like, which is not limited in the embodiment of the present disclosure.

For example, in the embodiment of the present disclosure, the light-emitting layer 2 may include a hole inject layer (HIL), a hole transport layer (HTL), a light-emitting layer (EML), an electron transport layer (EHL) and an electron inject layer (EIL) which are sequentially stacked.

A material for manufacturing of the hole inject layer may be CuPc, TiOPC, 2-TNATA, or the like; a material for manufacturing the hole transport layer may be aromatic amine, pyrazoline, or the like; a material for manufacturing the electron transport layer may be a coumarin derivative, a conjugated aromatic compound, or the like; a material for manufacturing the electron inject layer may be LiF, MgP, MgF2, Al2O3, or the like; and a material for manufacturing the light-emitting layer may be Alq3, Almq3, TBADN, or the like.

For example, in the embodiment of the present disclosure, a material for manufacturing the anode layer 3 may be Al, Ag, graphene, Al-ITO, ITO-Al-ITO, Ag-ITO, ITO-Ag-ITO, or the like.

Figure 5:
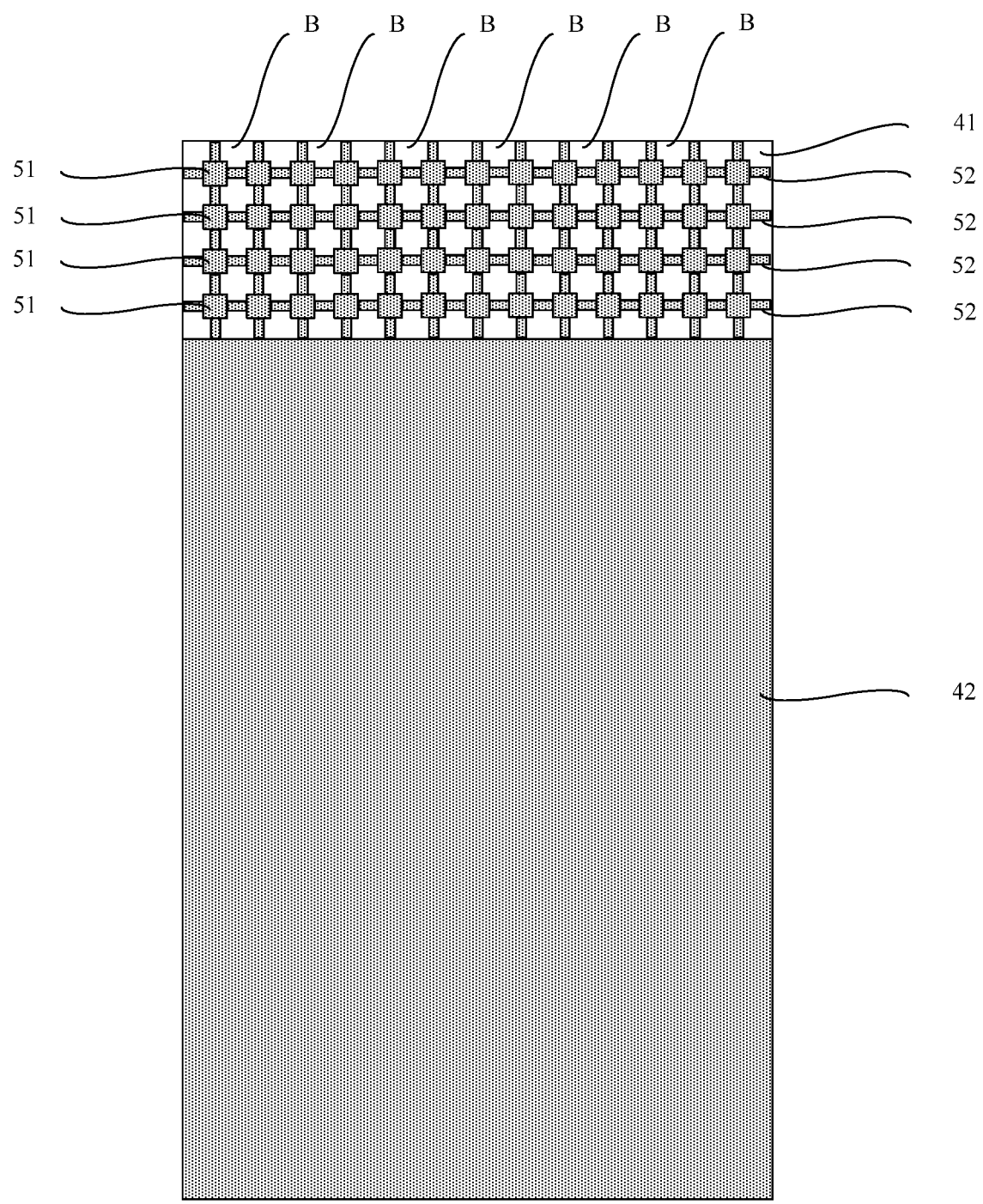
FIG. 5 is a schematic structural diagram of a display substrate according to an embodiment of the present disclosure.

FIG. 5 is a schematic structural diagram of a display substrate according to an embodiment of the present disclosure. As shown in FIG. 5, in the first display area, the target film layer includes a plurality of block structures 51 which are arranged in an array, and connecting structures 52 for connecting the two adjacent block structures 51. The target film layer in the first display area 41 includes the plurality of block structures 51 which are arranged in an array and are separated from each other. That is, gaps are formed among adjacent block structures 51. The gap can allow the infrared light to pass through to increase the light transmittance. For a film layer that needs electric connection entirely, such as a cathode layer, a plurality of connecting structures 52 for connecting the two adjacent block structures 51 may be arranged on the film layer besides the plurality of block structures 51, thereby ensuring that each position on the cathode layer can obtain the same voltage after the cathode layer is electrified. This structure may also be used for a film layer that is not required to be conductive, such as a CPL and an adhesive layer.

For example, as shown in FIG. 5, the target film layer may be a cathode layer. In the first display area 41, the cathode layer is provided with a plurality of block structures 51 and a plurality of connecting structures 52. The plurality of connecting structures are arranged in an array and the two adjacent block structures 51 are connected by the connecting structures 52, such that each of the block structures 51 on the cathode layer can obtain the same voltage after the cathode layer is electrified. Gaps defined by the plurality of block structures 51 and the plurality of connecting structures 52 are hollowed-out portions B.

Optionally, the block structures may be polygons or closed graphs formed by connecting curves. Furthermore, the connecting structures may be polygons or closed graphs formed by connecting curves. For a film layer with the block structures and the connecting structures simultaneously, the block structures and the connecting structures may be rectangular, pentagonal, circular, oval, or the like.

In a possible implementation, in the target film layer, the block structures are rectangular and the connecting structures are strip-shaped. That is, the block structures and the connecting structures are both quadrangular.

Figure 6:
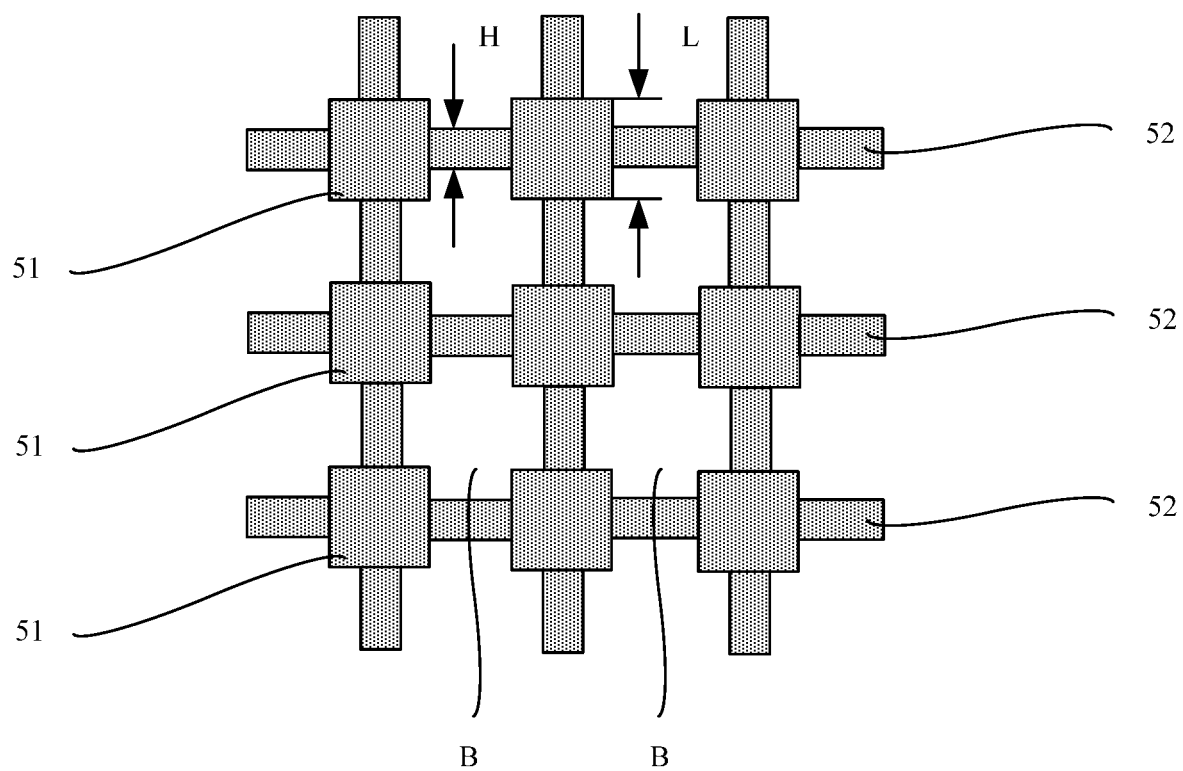
FIG. 6 is a partial enlarged schematic diagram of a display substrate according to an embodiment of the present disclosure.

For example, FIG. 6 is a partial enlarged schematic diagram of a display substrate according to an embodiment of the present disclosure. Referring to FIG. 5 and FIG. 6, the two ends of each of the strip-shaped connecting structures 52 are respectively connected to the opposite sides of the two adjacent block structures 51. The width H of the connecting structures 52 that is in a direction parallel to the sides where the block structures 51 and the connecting structures 52 are connected is not more than the length L of the block structures 51 that the sides where the block structures 51 and the connecting structures 52 are connected.

Optionally, when the width H of the connecting structures 52 is less than the length L of the sides of the block structures 51, as shown in FIG. 6, the hollowed-out portions B formed by the block structures 51 and the connecting structures 52 are cross-shaped. Because the width H of the connecting structures 52 is less than the length L of the sides of the block structures 51, fewer gap areas among the block structures 51 can be occupied by using the connecting structures 52 to connect with the block structures 51. The block structures 51 and the connecting structures 52 can form hollowed-out portions with larger area, which is beneficial to increasing the light transmittance.

Figure 7:
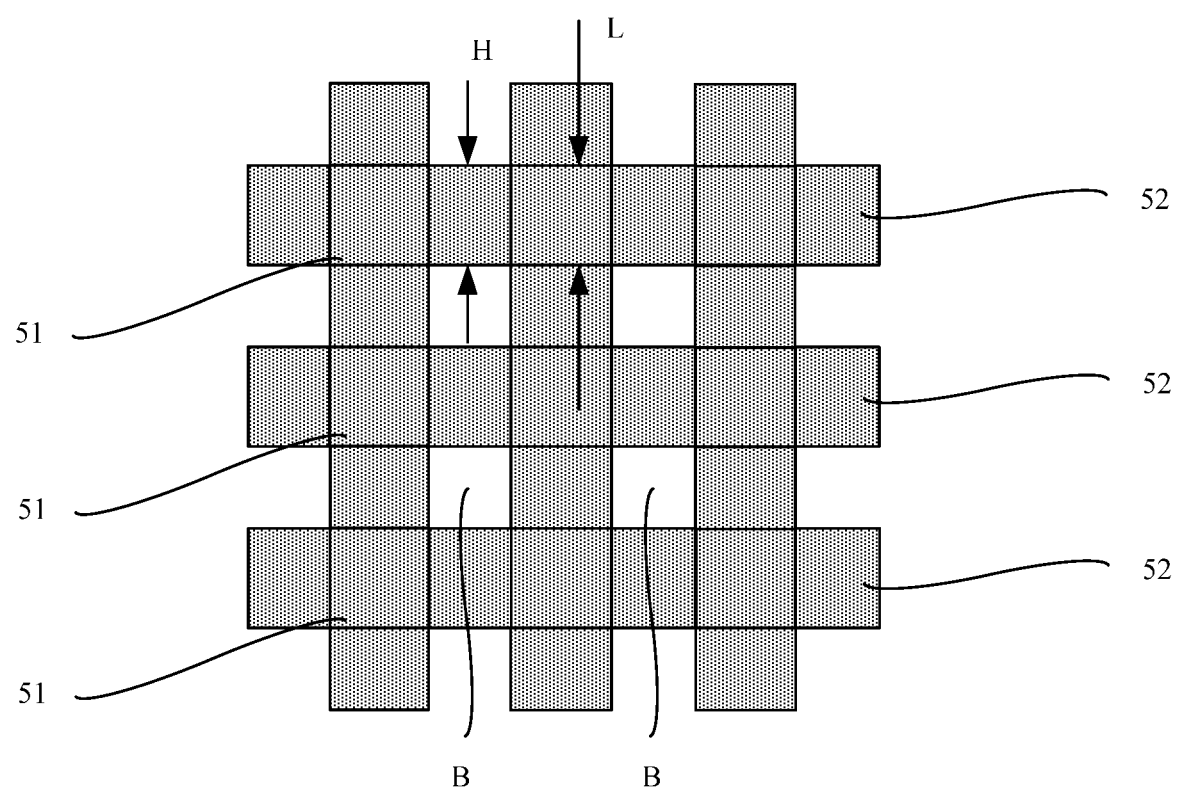
FIG. 7 is a partial enlarged schematic diagram of a display substrate according to an embodiment of the present disclosure.

Optionally, when the width H of the connecting structures 52 is equal to the length L of the sides of the block structures 51, as shown in FIG. 4 and FIG. 7, the hollowed-out portions B formed by the block structures 51 and the connecting structures 52 are rectangular. Because the width H of the connecting structures 52 is equal to the length L of the sides of the block structures 51, current can be stably transmitted among the block structures 51 by using the connecting structures 52 to connect with the block structures 51. Meanwhile, the block structures 51 and the connecting structures 52 can form hollowed-out portions with larger area to facilitate transmission of the infrared light.

In another possible implementation, in the target film layer, the block structures and the connecting structures are rectangular. That is, the block structures and the connecting structures are quadrangular.

Figure 8:
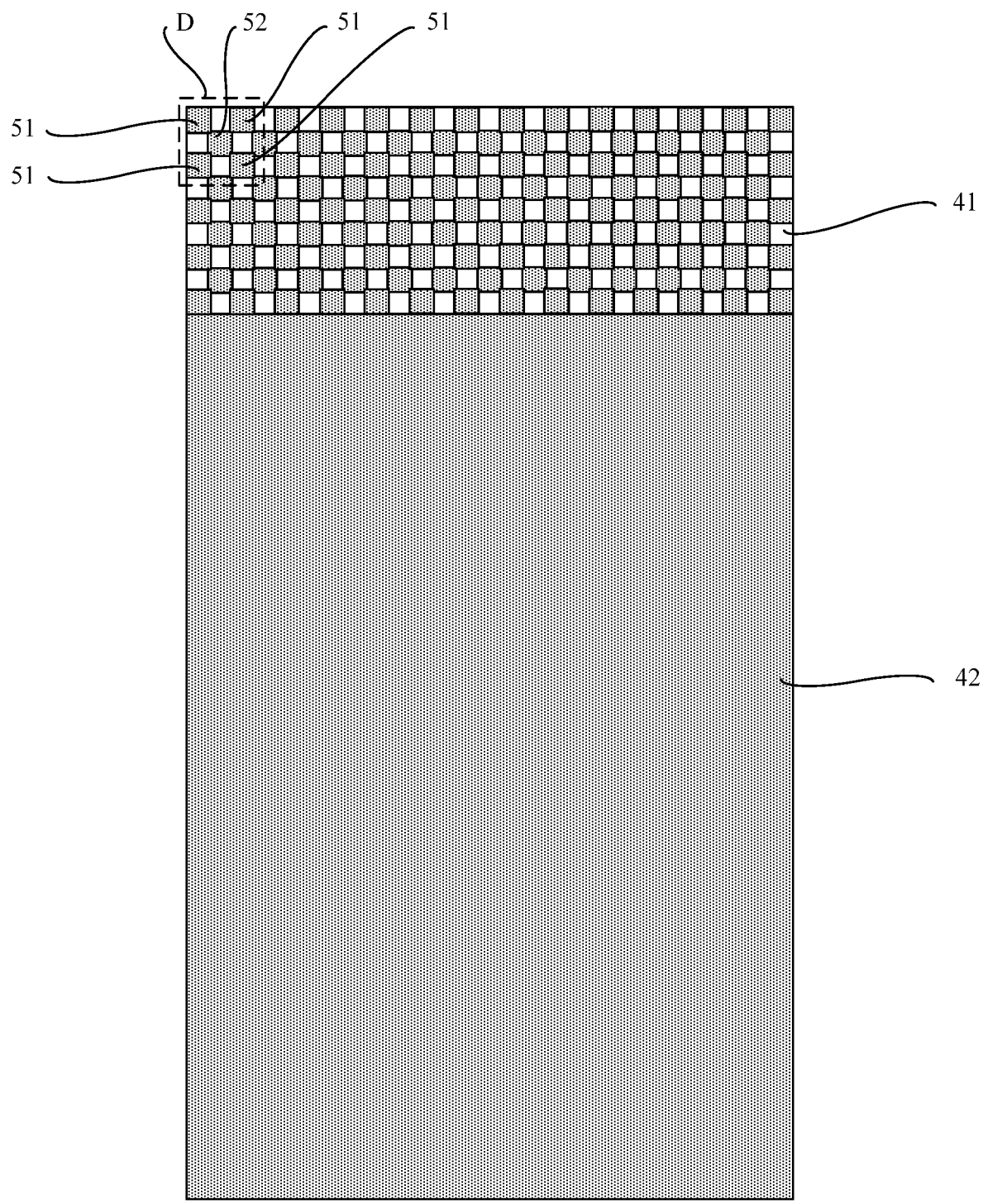
FIG. 8 is a schematic structural diagram of a display substrate according to an embodiment of the present disclosure.

For example, as shown in FIG. 8, the plurality of connecting structures 52 are arranged in an array, and four corners of each of the connecting structures 52 are respectively connected to corners of the four block structures 51. That is, a unit area D formed by any four block structures 51 arranged in an array is provided with one connecting structure 52, and the corner areas, proximal to the middle part of the unit area D, of the four block structures 51 are respectively connected to the four corner areas of the connecting structure 52. In an arrangement that the connecting structures 52 are connected to the sides of the block structures 51, conduction among the four block structures is realized by the four connecting structures 52. However, in FIG. 8, every four block structures 51 only need one connecting structure 52 to realize conduction among the four block structures, and the structural graph is simple.

Optionally, the block structures and the connecting structures have the same shape and size, such that the block structures and the connecting structures can be formed by the same mask, which is beneficial to saving the manufacturing cost.

Optionally, the anode layer includes a plurality of anodes which are arranged in an array; each of the block structures corresponds to at least one of the anodes; and an orthographic projection of each of the block structures on the array substrate covers an orthographic projection of the corresponding anode on the array substrate. In the embodiments of the present disclosure, the relationships between the block structure and the anode layer may include the following two types.

In a first relationship, each of the block structures corresponds to one anode. That is, the orthographic projection of each of the block structures on the array substrate covers the orthographic projection of the corresponding anode on the anode layer on the array substrate.

That is, each of the block structures is in one-to-one correspondence with each of the anodes on the anode layer, one block structure covers the corresponding anode, and the projection area of the block structure is equal to that of the corresponding anode.

Figure 9:
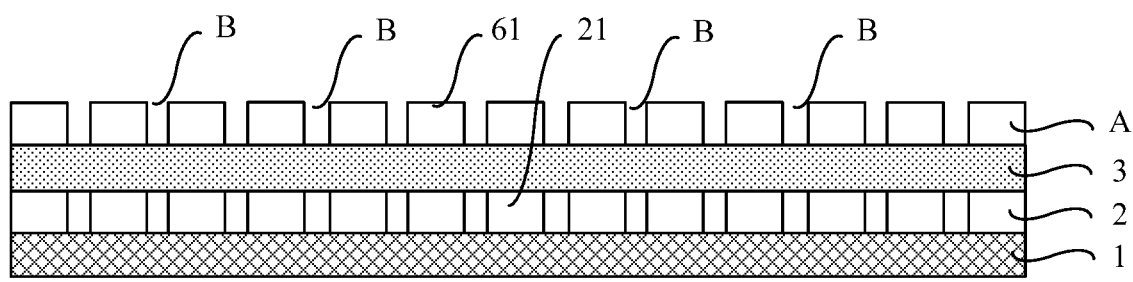
FIG. 9 is a schematic structural diagram of layers of a display substrate according to an embodiment of the present disclosure.

For example, as shown in FIG. 9, when the target film layer is a cathode layer, the block structures on the cathode layer are conductive blocks 61, and each of the conductive blocks 61 is in one-to-one correspondence with each of the anodes 21 in the anode layer 2. In this way, when a voltage is applied to the cathode layer and the anode layer 2, each of the anode 21s can correspond to one conductive block 61, such that each of the anodes 21 can be utilized. And the area of the anode 21 to the corresponding conductive block 61 is equal to that of the corresponding conductive block 61 to the anode 21, such that each of the anode 21 can be completely utilized, and the light-emitting effect of the display substrate is ensured while the light transmittance is increased.

For example, when the target film layer is a LiF film layer or a CPL, each of the block structures in the target film layer is in one-to-one correspondence with each of the anodes in the anode layer, such that the LiF film layer or the CPL can completely cover the pixel area (namely the anode) for controlling light emission of the display substrate in the anode layer, and the protection of the anode layer, the light-emitting layer and the cathode layer is realized.

In a second relationship, the orthographic projection of each of the block structures on the array substrate covers the orthographic projection of the plurality of corresponding anodes (at least two) on the anode layer on the array substrate.

That is, each of the block structures covers a plurality of anodes simultaneously, namely, the projection area of one block structure is more than that of one anode. In this case, the pattern precision requirement of the target film layer is low, which is beneficial to reducing the manufacturing cost.

Figure 10:
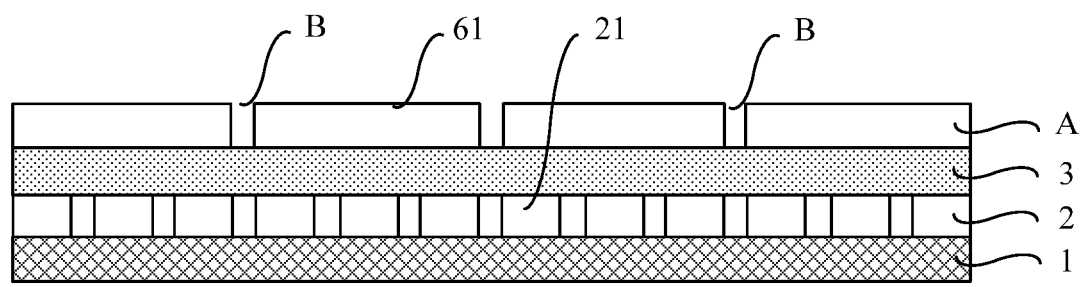
FIG. 10 is a schematic structural diagram of a display substrate according to an embodiment of the present disclosure.

For example, as shown in FIG. 10, when the target film layer is a cathode layer, the block structures on the cathode layer are conductive blocks 61, and each of the conductive blocks 61 corresponds to three anodes 21 on the anode layer 2 simultaneously, that is, each of the conductive blocks 61 covers three anodes 21 simultaneously. The structure of the cathode layer can ensure that each of the anodes 21 is covered, which ensures the light-emitting effect of the display substrate.

For example, when the target film layer is an LiF film layer or a CPL, each of the block structures on the film layer covers a plurality of anodes simultaneously, such that the LiF film layer or the CPL may completely cover the pixel area (namely the anode) for controlling the display substrate to emit light on the anode layer, and the protection of the anode layer, the light-emitting layer and the cathode layer is realized.

Alternately, a plurality of block structures on the target film layer may cover one anode simultaneously, and the area of one block structure is less than that of one anode. That is, the projection area of one block structure is less than that of one anode.

Figure 11:
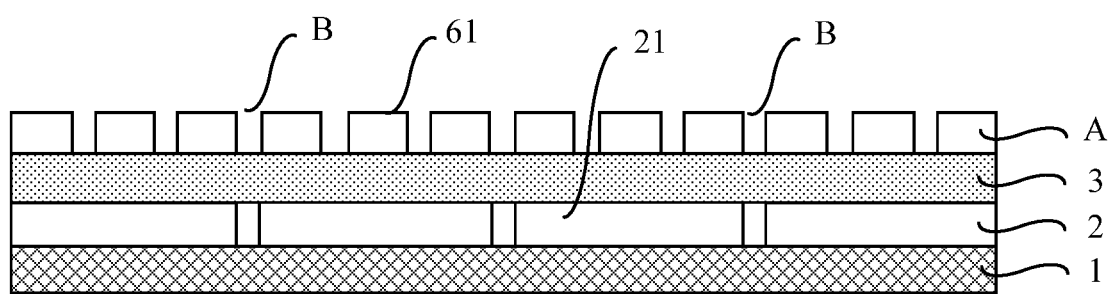
FIG. 11 is a schematic structural diagram of layers of a display substrate according to an embodiment of the present disclosure.

For example, as shown in FIG. 11, when the target film layer is a cathode layer, the block structures on the cathode layer are conductive blocks 61, and three conductive blocks 61 correspond to one anode 21 on the anode layer 2 simultaneously, that is, the three conductive blocks 61 cover one anode 21 simultaneously. The structure of the cathode layer has more hollowed-out portions B, such that more light can penetrate through the hollowed-out portions B to increase the light transmittance of the display substrate and the recognition efficiency of face recognition under the screen.

Figure 12:
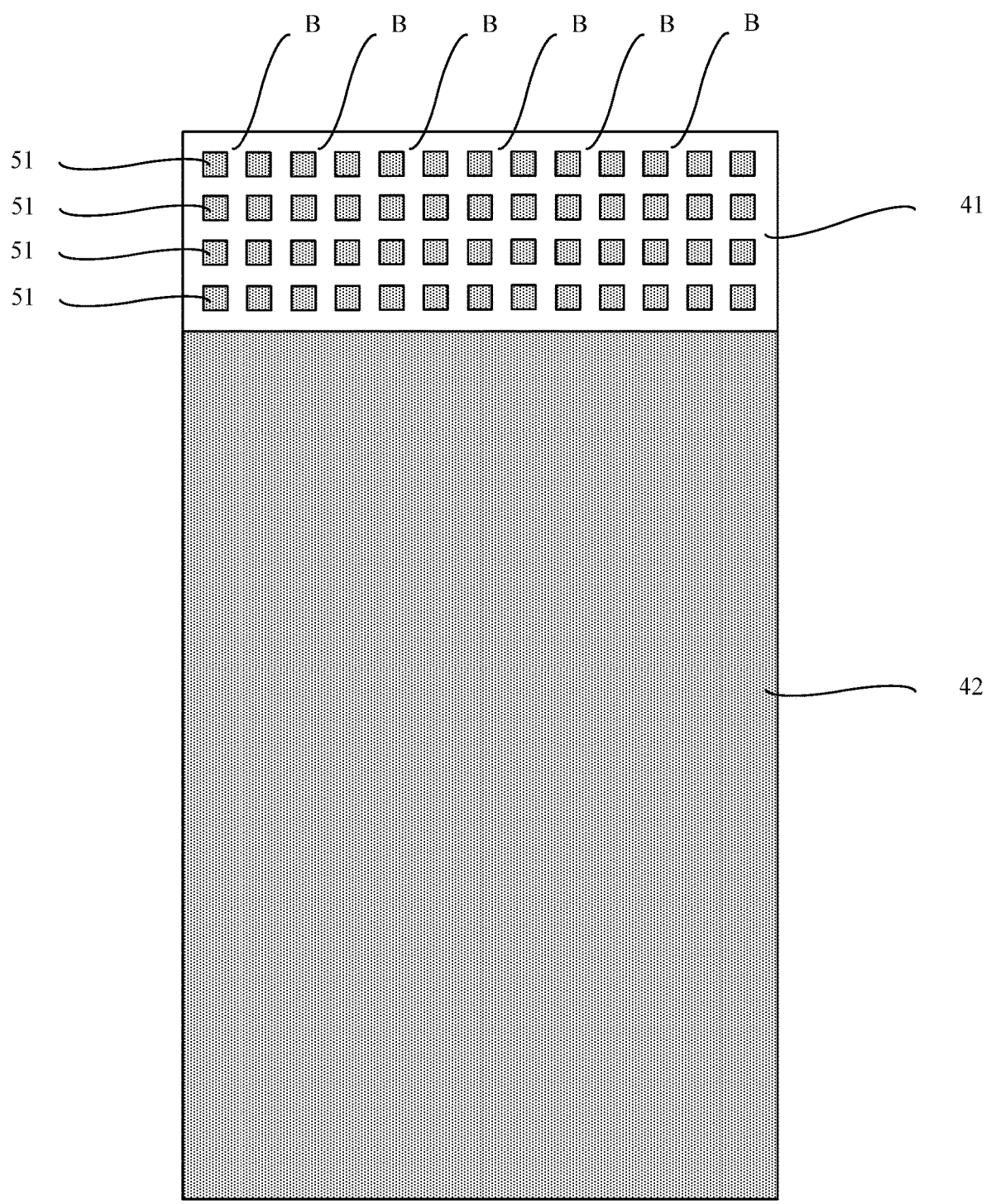
FIG. 12 is a schematic structural diagram of a display substrate according to an embodiment of the present disclosure.

FIG. 12 is a schematic structural diagram of a display substrate according to an embodiment of the present disclosure. The difference between the display substrate as shown in FIG. 12 and the display substrate as shown in FIG. 5 is that, as shown in FIG. 12, in the first display area 41 of the display substrate, the target film layer includes a plurality of block structures 51, but does not include connecting structures, that is, the target film layer only includes the block structures 51.

The plurality of block structures are arranged in an array. That is, gaps are formed between the mutually separated block structures 51. The gaps may allow the infrared light to penetrate through, which thereby increases the light transmittance. Since the target film layer is not provided with the connecting structures for connecting the block structures, the hollowed-out film layer is suitable for film layers without electricity. For example, an LiF film layer, a CPL, or the like.

For example, as shown in FIG. 12, the target film layer may be an LiF film layer. In the first display area 41, the LiF film layer has a plurality of block structures 51, wherein the plurality of block structures 51 are arranged in an array. The hollowed-out area of the hollowed-out film layer is even larger, such that the light transmittance of the display panel is higher.

Optionally, the anode layer in the display substrate as shown in FIG. 12 may also include a plurality of anodes which are arranged in an array. Each of the block structures corresponds to at least one anode, and an orthographic projection of each of the block structures on the array substrate covers an orthographic projection of the corresponding anode on the array substrate. Moreover, the hierarchical relationship between the block structures of the target film layer and the anodes of the anode layer in the display substrate may be as same as the hierarchical relationship between the block structures and the anodes as shown in FIG. 9 to FIG. 11, and is not described in the embodiment herein again.

Optionally, the block structures may be polygons or closed graphs formed by connecting curves. For a film layer only provided with the block structures, the block structures may be rectangular, pentagonal, circular, oval, or the like.

Figure 13:
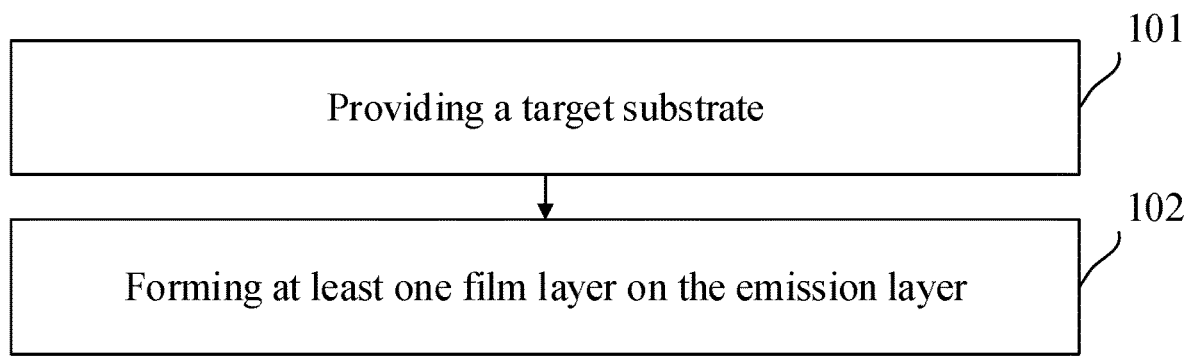
FIG. 13 is a flow chart of a method for manufacturing a display substrate according to an embodiment of the present disclosure.

FIG. 13 is a flow chart of a method for manufacturing a display substrate according to an embodiment of the present disclosure. As shown in FIG. 13, the manufacturing method includes the following steps.

Step 101: A target substrate is provided.

The target substrate includes an array substrate, an anode layer, and a light-emitting layer which are sequentially stacked; and Step 102: At least one film layer is formed on the light-emitting layer.

The at least one film layer includes a target film layer. In a first display area of the target substrate, the target film layer has hollowed-out portions; and in a second display area of the target substrate, the target film layer is in a non-hollowed-out structure.

In the embodiment of the present disclosure, the process of forming the target film layer having the hollowed-out portions on the light-emitting layer may be evaporation. The evaporation refers to a process in which a coating material is evaporated by a certain heating evaporation and then gasified, and particles of the coating materials fly to the surface of the substrate and are condensed thereon into a film.

Optionally, forming the target film layer on the light-emitting layer may include: forming a first film layer on the light-emitting layer, wherein the first film layer is positioned in the first display area and has hollowed-out portions; and forming a second film layer covering the second display area on the light-emitting layer, wherein the second film layer is in a non-hollowed-out structure, and the first film layer and the second film layer together form the target film layer.

In some implementations of the embodiment, forming the first film layer on the light-emitting layer includes the following two steps.

In a first step, block structures which are arranged in an array are formed in the first display area by a first grid mask. Openings on the first grid mask are rectangular openings which are arranged in an array.

In a second step, a connecting structure for connecting two adjacent block structures is formed in the first display area by a second grid mask. Openings on the second grid mask are strip-shaped openings for forming strip-shaped connecting structures.

Optionally, both the first grid mask and the second grid mask are assemblies of two masks. For example, each of the first grid mask and the second grid mask may be an assembly of a semi-open mask and a fine metal mask (FMM).

Figure 14:
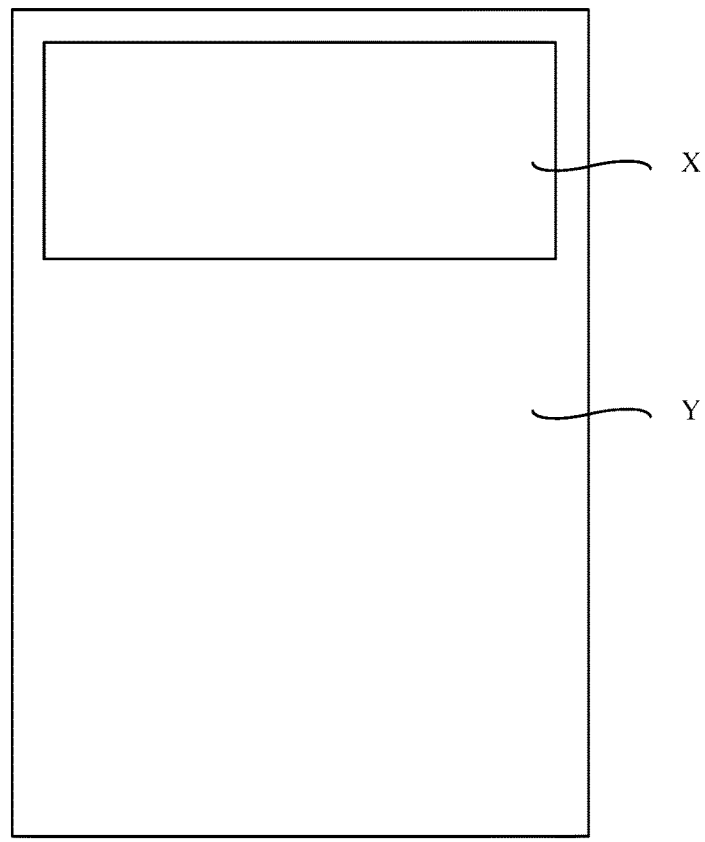
FIG. 14 is a schematic structural diagram of a mask according to an embodiment of the present disclosure.

The semi-open mask may be a semi-open F-mask (full mask) or a semi-open open mask. As shown in FIG. 14, the semi-open F-mask and the open mask Y may be a mask Y with an opening X. The opening X is positioned in a partial area of the mask Y, such that the partial area of the mask Y is hollowed out and the other partial area of the mask Y is enclosed, which forms a frame-shaped structure.

The fine metal mask is a grid mask. That is, the fine metal mask is provided with a plurality of openings which are formed by interweaving fine metal.

For example, the assembly of the semi-open mask and the fine metal mask may refer to a structure that a plurality of fine openings are formed by interweaving fine metal in the opening area of the semi-open mask.

Figure 15:
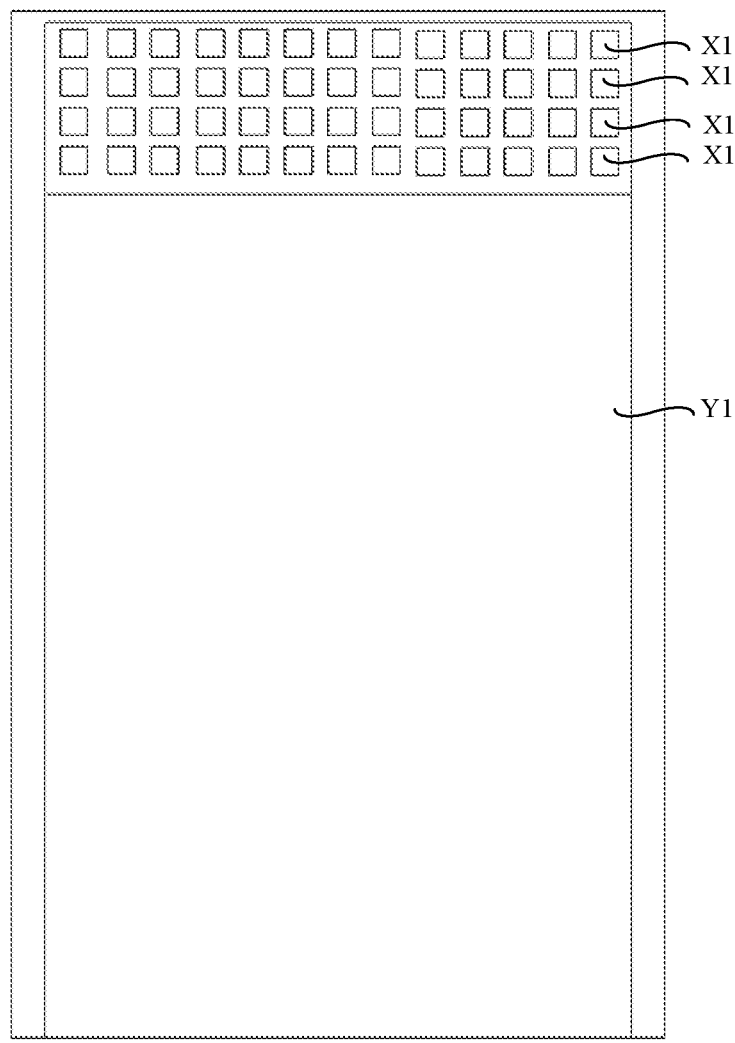
FIG. 15 is a schematic structural diagram of a mask according to an embodiment of the present disclosure.

Optionally, as shown in FIG. 15, the first grid mask Y1 is provided with a plurality of openings X1 arranged in an array, the first grid mask Y1 is configured to form a plurality of block structures corresponding to each of the anodes on the anode layer, and the plurality of block structures are arranged in an array.

Figure 16:
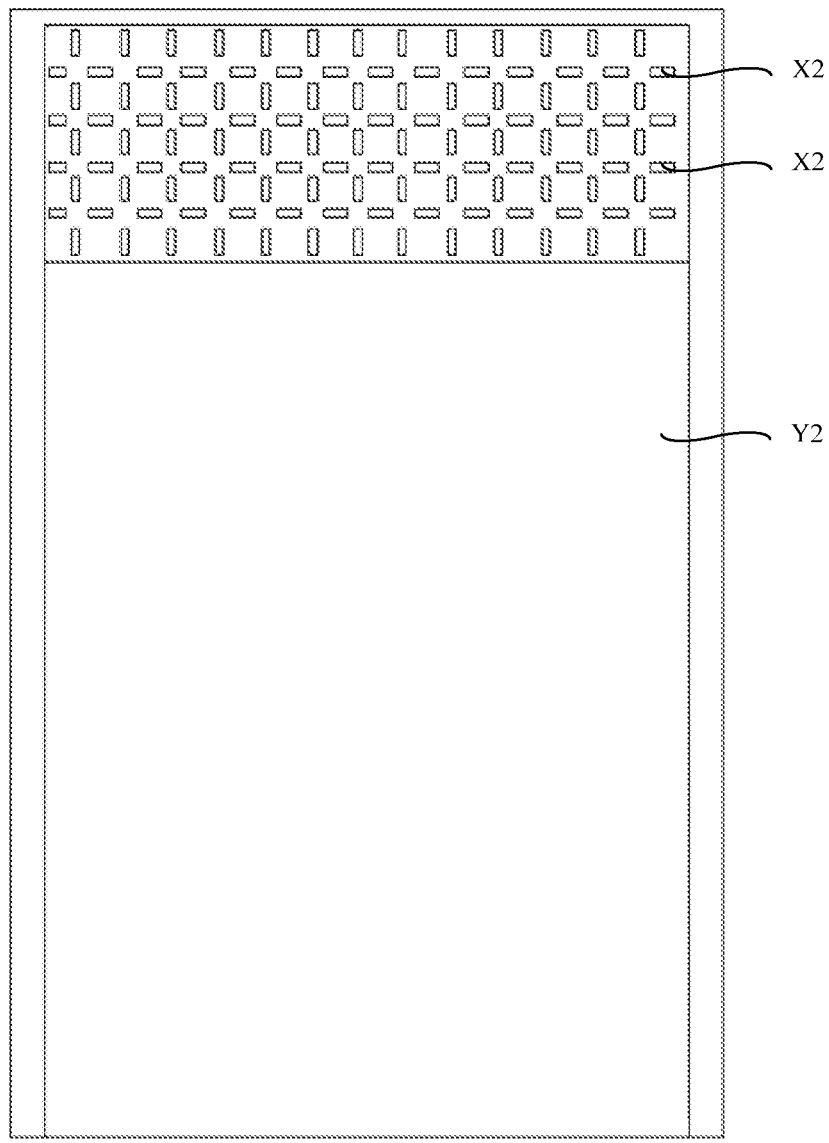
FIG. 16 is a schematic structural diagram of a mask according to an embodiment of the present disclosure.

Optionally, as shown in FIG. 16, the second grid mask Y2 is provided with a plurality of openings X2 spaced apart from each other, the second grid mask Y2 is configured to form a plurality of connecting structures for connecting the plurality of block structures, wherein the plurality of connecting structures are also spaced apart from each other.

In the first step, evaporation is performed for the first time by the first grid mask as shown in FIG. 15. The block structures arranged in an array are formed in the first display area after the evaporation, and patterned coverage of the target film layer above the anode layer in the first display area is realized, thereby obtaining the pattern as shown in FIG. 12.

In the second step, evaporation is performed for the second time by the second grid mask as shown in FIG. 16. The connecting structures for connecting each of the block structures are formed in the first display area after the evaporation, and mutual connections among the block structures spaced apart from each other in the first display area are realized, thereby obtaining the pattern as shown in FIG. 5.

In other implementations of the embodiment, forming the first film layer on the light-emitting layer may include the following three steps.

In a first step, block structures which are arranged in an array in the first display area is formed by a first grid mask. Openings on the first grid mask are rectangular openings which are arranged in an array.

In a second step, the first grid mask is translated.

In a third step, a plurality of connecting structures arranged in an array are formed in the first display area by the first grid mask.

Four corners of the connecting structure are respectively connected to corners of the four block structures.

In the embodiment, the first grid mask may be an assembly of a semi-open mask and a fine metal mask (FMM).

For example, the assembly of the semi-open mask and the fine metal mask may refer to that a plurality of fine openings are formed by interweaving fine metal in an opening area of the semi-open mask.

Optionally, as shown in FIG. 15, the first grid mask Y1 is used for forming a plurality of block structures corresponding to each of the anodes on the anode layer. The plurality of block structures are arranged in an array.

In the first step, evaporation is performed for the first time by the first grid mask as shown in FIG. 15. The block structures arranged in an array are formed in the first display area after the evaporation, and patterned coverage of the target film layer above the anode layer in the first display area is realized, thereby obtaining a pattern as shown in FIG. 12.

In the second step, the first grid mask is translated towards a set direction, such that the pattern formed by evaporation for the second time may be connected to the block structures arranged in an array.

For example, in the first evaporation for the first time, each of the block structures formed by the first grid mask is rectangular. In the second evaporation, the first grid mask is translated towards the direction of a diagonal line of the block structures, such that four corner areas of each of the rectangular connecting structures formed by the evaporation for the second time are respectively connected to corner areas of the adjacent block structures, and the connections between the block structures and the connecting structures are realized, thereby obtaining a pattern as shown in FIG. 8.

It should be noted that when the block structures and the connecting structures are conductive structures, for example, a cathode layer, pixels in the first display area can be ensured to normally emit light.

In other implementations of the embodiment, forming the second film layer covering the second display area on the light-emitting layer may include: forming an entire-surface film layer in the second display area by a single-open mask.

The single-open mask is provided with an opening corresponding to the second display area, and the shape and area of the opening of the single-open mask are the same as those of the second display area.

Figure 17:
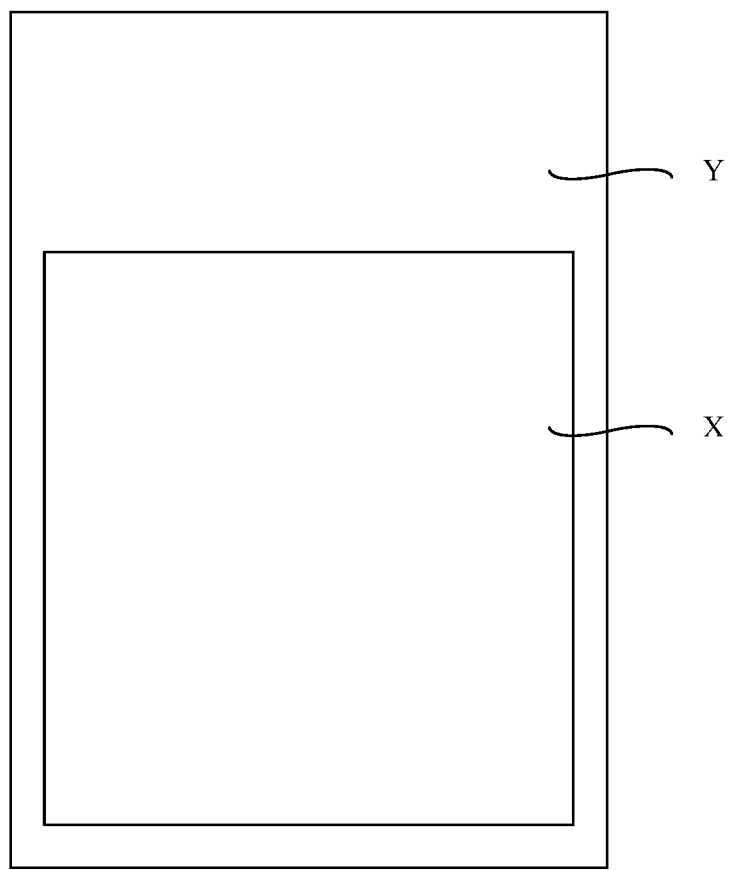
FIG. 17 is a schematic structural diagram of a mask according to an embodiment of the present disclosure.

In the embodiment, the single-open mask is a semi-open mask. Herein, the semi-open mask may be a semi-open F-mask (full mask) or a semi-open open mask. F-mask and Open mask belong to full-open masks, wherein the full-open mask is provided with an opening that covers most area of the mask, such that the single-open mask is frame-shaped. As shown in FIG. 17, each of the semi-open F-mask and the Open mask may be a single-open mask with an opening that is positioned in a partial area of the mask, such that the partial area of the single-open mask is hollowed out and the other partial area of the single-open mask is enclosed.

For example, the single-open mask may be a semi-open open mask. Uniform coverage of the whole cathode layer in the second display area can be realized by the semi-open open mask, and pixels in the second display area can be ensured to emit light normally.

When the target film layer is formed on the light-emitting layer, the anode layer is covered with the cathode layer through evaporation for three times. Uniformity of the cathode layer in the second display area is ensured by evaporation of a semi-open open mask. Anode coverage of the first display area is realized by evaporation of an assembly of an FMM and a semi-open open mask in the first display area. Conductive blocks of cathode and the connecting structures are mutually connected by evaporation of the FMM and the semi-open open mask in the first display area.

In the embodiments of the present disclosure, uniform coverage of the target film layer in the second display area may be ensured (pixels in the second display area emit light normally), and pixels in the first display area may be ensured to normally emit light. Meanwhile, the coverage area of the target film layer is reduced and the light transmittance of the first display area is increased, thus ensuring implementation of an under-the-screen infrared camera function of the first display area.

The embodiment of the present disclosure provides a display device. The display device includes a display substrate as mentioned above.

For example, the display device provided by the embodiment of the present disclosure may be any one products or parts with a display function, such as a mobile phone, a tablet computer, a television, a display, a notebook computer, a digital photo frame, a navigator, or the like.

Optionally, the display device also may include a photosensitive device, and an orthographic projection of the photosensitive device on the display substrate falls within the first display area, that is, the photosensitive device is positioned on one side of the first display area. Due to the high light transmittance of the first display area, arranging the photosensitive device in the first display area is beneficial to improving the performance of the photosensitive device.

In the embodiment of the present disclosure, the photosensitive device may be positioned on one side, proximal to an array substrate, of the first display area. For example, the photosensitive device may be an infrared camera.

Optionally, the display device may also include a light-emitting device, and an orthographic projection of the light-emitting device falls within the first display area, that is, the light-emitting device is positioned on one side of the first display area. For example, the photosensitive device may be an infrared transmitting tube, or the like.

The term "at least one of A and B" in the present disclosure merely describes the association relationship between the associated objects and indicates that there may be three relationships. For example, at least one of A and B may indicate three cases where only A exists, A and B exist at the same time, or only B exists.

It should be noted that in the accompanying drawings, for clarity of the illustration, the dimension of the layers and areas may be scaled up. And it can be understood that when an element or layer is described as being "above" another element or layer, the described element or layer may be directly on the other element, or an intermediate layer may be arranged between the described element or layer and the other element. In addition, It may be understood that when an element or layer is described as being "below" another element or layer, the described element or layer may be directly below the other element, or at least one intermediate layer or element may be arranged between the described element or layer and the other element. In addition, it may be further understood that when a layer or element is described as being arranged "between" two layers or elements, the described layer or element may be the only layer between the two layers or elements, or at least one intermediate layer or element may be arranged between the described element or layer and the two layers or elements. In the whole specification described above, like reference numerals indicate like elements.

Described above are merely exemplary embodiments of the present disclosure, and are not intended to limit the present disclosure. Within the spirit and principles of the disclosure, any modifications, equivalent substitutions, improvements, or the like are within the protection scope of the present disclosure.

What is claimed is:

1. A display substrate, comprising an array substrate, an anode layer, and a light-emitting layer which are sequentially stacked, and at least one film layer positioned on the light-emitting layer; wherein the at least one film layer comprises a target film layer; and the display substrate comprises a first display area and a second display area which are adjacent to each other; wherein
   in the first display area, the target film layer has hollowed-out portions; and
   in the second display area, the target film layer is in a non-hollowed-out structure,
   in the first display area, the target film layer comprises a plurality of block structures which are arranged in an array, wherein the anode layer comprises a plurality of anodes which are arranged in an array; each of the block structures corresponds to one of the anodes; each of the block structures is a cathode, and an orthographic projection of each of the block structures on the array substrate completely overlaps an orthographic projection of the corresponding anode on the array substrate.

2. The display substrate according to claim 1, wherein the target film layer adopts one of the following structures:
   in the first display area, the target film layer comprises a plurality of block structures which are arranged in an array, and a connecting structure for connecting two adjacent block structures.

3. The display substrate according to claim 2, wherein the block structures are rectangular; the connecting structure is strip-shaped; and two ends of each of the connecting structures are respectively connected to opposite sides of the two adjacent block structures.

4. The display substrate according to claim 2, wherein the block structure and the connecting structure are both rectangular; a plurality of connecting structures are arranged in an array; and four corners of each of the connecting structures are respectively connected to corners of the four block structures.

5. The display substrate according to claim 1, wherein pixels per inch of the first display area is not more than pixels per inch of the second display area.

6. The display substrate according to claim 1, wherein the target film layer
   comprises at least one of a cathode layer, an adhesive layer, and a capping layer.

7. The display substrate according to claim 1, wherein a material of the target film layer comprises a metal element.

8. A method for manufacturing a display substrate, comprising:
   providing a target substrate, wherein the target substrate comprises an array substrate, an anode layer, and a light-emitting layer which are sequentially stacked; and
   forming at least one film layer on the light-emitting layer, the at least one film layer comprising a target film layer; wherein in a first display area of the target substrate, the target film layer has hollowed-out portions; in a second display area of the target substrate, the target film layer is in a non-hollowed-out structure; and the first display area and the second display area are adjacent to each other,
   in the first display area, the target film layer comprises a plurality of block structures which are arranged in an array, wherein the anode layer comprises a plurality of anodes which are arranged in an array; each of the block structures corresponds to one of the anodes; each of the block structures is a cathode, and an orthographic projection of each of the block structures on the array substrate completely overlaps an orthographic projection of the corresponding anode on the array substrate.

9. The method according to claim 8, wherein forming the target film layer on the light-emitting layer comprises:
   forming a first film layer on the light-emitting layer, wherein the first film layer is positioned in the first display area and has hollowed-out portions; and
   forming a second film layer covering the second display area on the light-emitting layer, wherein the second film layer is in a non-hollowed-out structure, and the first film layer and the second film layer form the target film layer.

10. The method according to claim 9, wherein forming the first film layer on the light-emitting layer comprises:
- forming block structures which are arranged in an array in the first display area by a first grid mask, wherein openings on the first grid mask are rectangular openings which are arranged in an array; and
- forming a connecting structure for connecting two adjacent block structures in the first display area by a second grid mask, wherein the connecting structure is strip-shaped and openings on the second grid mask are strip-shaped openings.

11. The method according to claim 9, wherein forming the first film layer on the light-emitting layer comprises:
- forming block structures which are arranged in an array in the first display area by a first grid mask, wherein openings on the first grid mask are rectangular openings which are arranged in an array;
- translating the first grid mask; and
- forming a plurality of connecting structures which are arranged in an array in the first display area by the first grid mask, wherein four corners of each of the connecting structures are respectively connected to corners of the four block structures.

12. The method according to claim 9, wherein forming the second film layer covering the second display area on the light-emitting layer comprises:
- forming an entire-surface film layer in the second display area by a single opening mask, wherein the single opening mask is provided with an opening corresponding to the second display area.

13. A display device, comprising a display substrate, the display substrate
- comprising an array substrate, an anode layer, and a light-emitting layer which are sequentially stacked, and at least one film layer positioned on the light-emitting layer;
- wherein the at least one film layer comprises a target film layer; and the display substrate has a first display area and a second display area which are adjacent to each other; wherein in the first display area, the target film layer has hollowed-out portions;
- and in the second display area, the target film layer is in a non-hollowed-out structure,
- in the first display area, the target film layer comprises a plurality of block structures which are arranged in an array, wherein the anode layer comprises a plurality of anodes which are arranged in an array; each of the block structures corresponds to one of the anodes; each of the block structures is a cathode, and an orthographic projection of each of the block structures on the array substrate completely overlaps an orthographic projection of the corresponding anode on the array substrate.

14. The display device according to claim 13, further comprising at least one of the following devices:
- a photosensitive device, an orthographic projection of the photosensitive device on the display substrate falling within the first display area; and
- a light-emitting device, an orthographic projection of the light-emitting device on the display substrate falling within the first display area.

15. The display device according to claim 13, wherein the target film layer adopts one of the following structures:
- in the first display area, the target film layer comprises a plurality of block structures which are arranged in an array and a connecting structure for connecting two adjacent block structures; and
- in the first display area, the target film layer a plurality of block structures which are arranged in an array.

16. The display device according to claim 13, wherein the block structure are rectangular; the connecting structures are strip-shaped; and two ends of each of the connecting structures are respectively connected to the opposite sides of two adjacent block structures.

17. The display device according to claim 13, wherein the block structure and the connecting structure are both rectangular; a plurality of connecting structures are arranged in an array; and four corners of each of the connecting structures are connected to corners of the four block structures respectively.

18. The display device according to claim 13, wherein the anode layer comprises
- a plurality of anodes which are arranged in an array; each of the block structures corresponds to at least one of the anodes; and an orthographic projection of each of the block structures on the array substrate covers an orthographic projection of the corresponding anode on the array substrate.

19. The display device according to claim 13, wherein the target film layer
- comprises at least one of a cathode layer, an adhesive layer, and a capping layer.

* * * * *